United States Patent [19]

Sheller

[11] 4,150,337
[45] Apr. 17, 1979

[54] COMPARATOR CIRCUIT APPARATUS

[75] Inventor: Daniel R. Sheller, Cedar Rapids, Iowa

[73] Assignee: Rockwell International Corporation, El Segundo, Calif.

[21] Appl. No.: 853,967

[22] Filed: Nov. 21, 1977

[51] Int. Cl.² .............................................. H03K 21/30
[52] U.S. Cl. ........................................ 328/48; 328/44; 235/92 PE; 235/92 CA; 235/92 PL
[58] Field of Search ............... 328/44, 48; 235/92 PE, 235/92 PB, 92 CA, 92 PL

[56] References Cited

U.S. PATENT DOCUMENTS

| | | | |
|---|---|---|---|
| 3,064,890 | 11/1962 | Butler | 328/48 X |
| 3,383,525 | 5/1968 | Arksey | 328/48 X |
| 3,636,549 | 1/1972 | Berman et al. | 235/92 PE |
| 3,962,565 | 6/1976 | Guyen-Phuoc | 235/92 CA |
| 4,041,280 | 8/1977 | Ohsako et al. | 235/92 PE |

Primary Examiner—John S. Heyman
Attorney, Agent, or Firm—Bruce C. Lutz; H. Fredrick Hamann

[57] ABSTRACT

The method and circuitry for detecting two different binary numbers or digital words in a register or counter using logic gates wherein bits are detected using n-1 logic gates when all the digits of each of words or numbers are at the same one of a plurality of possible logic levels. In other words, two numbers such as all logic ones as the first number and all logic zeros as the second number. Specifically, this concept is applied to checking an up-down counter output so that it is prevented from overflowing or underflowing by stopping it at either a count of all logic zeros or all logic ones.

4 Claims, 3 Drawing Figures

COMPARATOR CIRCUIT APPARATUS

THE INVENTION

The present invention is concerned generally with electronics and more specifically with a circuit for providing a given logic output when either of two binary numbers or counts occur.

The problem to be solved by the present invention is to obtain an output when either a count of all logic ones or a count of all logic zeros is obtained. The occurrence of either of these counts is to be used to stop an up-down counter so that it does not proceed to "flip over" by either underflowing or overflowing and commence counting again.

In the prior art, two approaches were normally used, the first approach was to use a pair of holding registers one of which would contain one count number or word and the other which would contain the other count number and then to use a pair of comparison circuits such as a number 7485 integrated circuit chip to compare the number in each of the holding registers with the number at the output of the counter and provide a given output when the comparison is identical. If there were four digits in the counter output, two of these chips would have been used and more chips would be used if there were more than four digits. The outputs of the two chips would be passed through an OR gate and then back to the counter to stop the counting operation.

A second approach of the prior art would be a decoding operation wherein logic gates would be used to provide an output when a given binary count was input thereto. Since the two counts under consideration are very easy to decode using this approach, this could be accomplished by providing the outputs of the counter first to an AND gate and then also through inverters to another AND gate. The outputs of the two gates would then be passed through an OR gate and returned to the counter to stop counter operation.

The present approach to solving the problem of preventing overflow or underflow is different from and believed novel as compared to either of the prior art approaches. Since the two counts desired to be detected have all of the digits of each of the counts identical, the present invention compares the logic level of the first bit with the logic level of the second bit in a first comparison circuit. If the two compare, a logic one will appear at an intermediate output. The second bit is then compared with the third bit and so on and if all the bits compare, there will be a logic one on each of n-1 logic comparison circuits if there are n bits to be decoded. Thus, for a given set of logic comparisons, both the binary numbers zero and whatever number is represented by all logic ones can be detected. The outputs of all the logic gates are then supplied to a logic gate which will provide an output to stop the counter when all the inputs are logic one.

It is thus an object of the present invention to provide an improved and simplified count detection circuit.

Other objects and advantages of the present invention will be ascertained from a reading of the specification and appended claims in conjunction with the drawing wherein:

Figure 1:
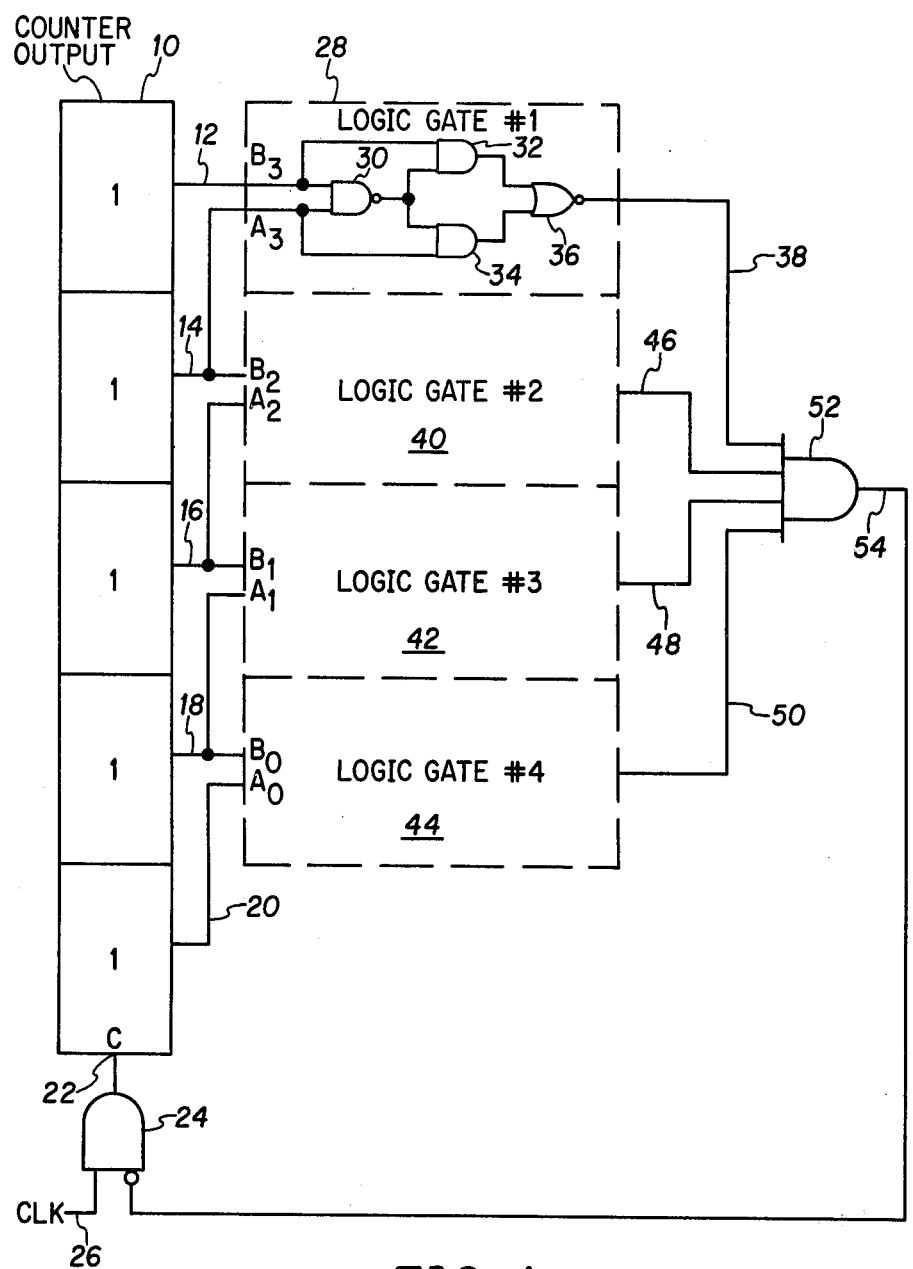
FIG. 1 is a schematic diagram of one embodiment of the invention.

In FIG. 1, a counter 10 is illustrated as having a total count of five digits and thus having five output leads 12, 14, 16, 18, and 20. Counter 10 has a clock input 22 which receives signals from an AND gate 24 wherein one of the inputs to AND gate 24 is a clock input 26. With each input logic one from AND gate 24, counter 10 advances one binary digit and as illustrated contains all logic ones. The two outputs 12 and 14 are shown as inputs B3 and A3, respectively, to a logic gate 28 wherein the B3 input is applied both to a NAND gate 30 and to an AND gate 32. The A3 input from lead 14 is connected to a second input of NAND gate 30 and to a further AND gate 34. The output of NAND gate 30 is connected to a further input of each of AND gates 32 and 34 and the outputs of these two AND gates is connected to a NOR gate 36 for providing an output from block 28 on a lead 38. Further logic gates are illustrated and designated as 40, 42 and 44. Logic gate 40 receives inputs on its B2 and A2 inputs respectively from leads 14 and 16 of counter 10. Logic gate 42 receives inputs on its B1 and A1 inputs from leads 16 and 18, respectively, from counter 10. And finally, logic gate 44 receives inputs on its B0 and A0 inputs from leads 18 and 20 of counter 10. Logic gates 40, 42 and 44 have outputs, respectively, designated as 46, 48 and 50 each corresponding to output 38 of logic gate 28. The leads 38, 46, 48 and 50 are applied as inputs to a multiple input AND gate 52 having an output lead 54 which is inverted and applied as a second input to AND gate 24.

As will be realized, the counter 10 may also be any type of register or holding means which will contain a binary number and from which it is desired to have a detection that all of the binary digits contained therein are identical in value.

Figure 2:
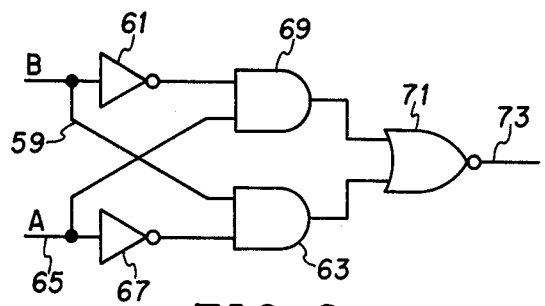
FIG. 2 is a drawing illustrating an alternate logic gate for use in FIG. 1.
Figure 3:
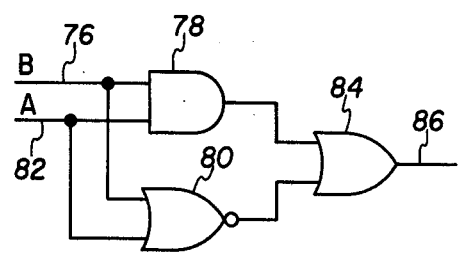
FIG. 3 is a further alternate logic gate for use in the circuit of FIG. 1.

While the logic gates of FIG. 1 are illustrated in one form, they may be replaced by either of FIGS. 2 and 3 wherein FIG. 2 is illustrated as having a B input labeled 59 which is connected to an inverter 61 as well as being connected to an input of AND gate 63. An A input is also labeled as 65 and is connected to an inverter 67 as well as to an input of an AND gate 69. An output of inverter 61 is connected to a second input of AND gate 69 while an output of inverter 67 is connected to a second input of AND gate 63. The outputs of the two AND gates 63 and 69 are connected to separate inputs of a NOR gate 71 whose output is designated as 73 and would correspond to the outputs such as 38 in FIG. 1.

A "B" input of FIG. 3 is further labeled as 76 and is connected to an input of an AND gate 78 as well as to an input of a NOR gate 80. A "A" input is labeled as 82 and is connected to a second input of AND gate 78 as well as to a second input of NOR gate 80. The outputs of gates 78 and 80 are connected as separate inputs to an OR gate 84 which has an output 86 corresponding to output 73 of FIG. 2.

OPERATION

As previously indicated, the logic gates 1 through 4 starting with gate 1 compares two logic bit positions and provides a logic one output if the bits in both positions are identical in logic value. It may be assumed for convenience that the logic value of the first two bit positions as output on leads 12 and 14 are logic one as illustrated. This would provide logic one inputs to one input of each of AND gates 32 and 34. It would also provide two logic one inputs to NAND gate 30 and thus provide a logic zero output such that the outputs of both of the AND gates 32 and 34 are logic zero thereby providing a logic one output from NOR gate 36. If, on the other hand, the logic values on each of 12 and 14 are logic zero, the AND gates 32 and 34 will automatically be a logic zero output and the same result will occur from NOR gate 36. If, on the other hand, lead 12 provides a logic zero while lead 14 provides a logic one, the NAND gate 30 will provide a logic one output since if either input is a logic zero the output will be a logic one. Thus, AND gate 34 will provide a logic one output and thus force NOR gate 36 to a logic zero output. The reverse logic inputs on leads 12 and 14 will produce the same result except that AND gate 32 will have the logic one output rather than gate 34.

The same operational result will occur with respect to gates 40, 42 and 44 and it should be noted that one less gate is required than there are bit positions in the counter to be checked. Further, although each logic gate is illustrated as comparing adjacent bit positions, each of the logic gates could be connected with the B input to lead 12 and the A input to successive output bit positions such as 14 through 20. The only requirement is that each bit position be compared with some other bit position. As long as one of the logic gates provides a logic zero output thereby indicating that all the bit positions in counter 10 are not identical, AND gate 52 will provide a logic zero output which as inverted at the input to AND gate 24 provides a logic one and allows passage of clock signals from lead 26. However, as soon as all the inputs to AND gate 52 are logic one, a logic one output appears on lead 54 and when inverted at the input to AND gate 24 turns it off and prevents passage of further clock signals. Thus, counter 10 is prevented from overflowing and merely stays in the maximum digital number position. If the counter were an up-down counter, (not shown for the purposes of simplicity) the same action would occur to prevent underflow from an all logic zero condition back to an all logic one condition.

The logic gate of FIG. 2 operates in a manner similar to that as explained above and if it be assumed that logic ones are applied at each of leads 59 and 65, it will be noted that upon inversion in the inverters 61 and 67, the AND gates 63 and 69 will thus have logic one and logic zero inputs thereby requiring that the outputs be logic zero such that the NOR gate 71 will have a logic one output. The same action will occur if both inputs are a logic zero on leads 59 and 65. However, if one of the leads such as 59 is a logic zero while lead 65 is a logic one, the inversion of the logic zero in inverter 61 will provide two logic ones to AND gate 69 and thus provide a logic one output so that NOR gate 71 will provide a logic zero output on lead 73 thereby providing the desired action.

In FIG. 3, the same end results also occur in that if the two inputs are identical, one or the other of logic gates 78 or 80 will provide a logic one output thereby passing through OR gate 84 to output lead 86. If, on the other hand, either of the two inputs on lead 76 and 82 are unlike, the outputs of each of AND gate 78 and NOR gate 80 will be a logic zero output and thus a logic zero will appear on lead 86.

Although only one embodiment of the overall inventive concept has been provided since a unidirectional counter is illustrated, it is to be realized that bidirectional counters such as up-down counters may properly be used as well as any other type of register which may be used to store numbers or words. Also, although three different types of logic gates are illustrated, the showing is not exhaustive and the concept will work with any type of simple comparison circuit for accomplishing the desired end result. Therefore, I wish to be limited only by the scope of the appended claims wherein it is claimed.

What is claimed is:

1. The method of ascertaining that all N of the digits of a binary number have the same logic value in N−1 comparisons comprising the steps of:
   comparing the logic value of each of the digits with the logic value of at least one other digit, and
   providing an output signal when all the comparisons are identical.

2. The method of stopping a binary digital counter when all N monitored digits thereof are at the same one of a plurality of possible logic levels wherein the counter has a count input means comprising, the steps of:
   comparing the logic value of each of the monitored output digits with at least one other output digit in the group of monitored digits in N−1 comparisons, and
   preventing the application of further count input signals to the counter when all comparisons are identical.

3. Apparatus for preventing counter overflow and underflow comprising, in combination:
   binary counter means having an overflow count comprising a plurality N of logic 1's and an underflow count having the same plurality N of logic 0's, said counter means including count signal input means;
   comparison means including N−1 pairs of comparison inputs and means for providing an output signal when each of the N−1 comparison pairs indicate the same comparison result;
   means connecting the output of said counter means to the comparison means whereby each of the N digit outputs of said counter means are compared with at least one other digit in the N−1 comparisons of said comparison means, and signal supplying means connected to said counter means and to said comparison means for providing an input signal to be counted at times when an output signal is not received from said comparison means.

4. Apparatus for monitoring circuitry containing a digital word to provide an output when N digits thereof are all at the same one of a plurality of possible logic levels comprising, in combination:
   source means for providing a plurality of parallel lines, a signal on each of which is capable of changing between at least two logic levels;
   N−1 first logic gate means, each connected to two of said plurality of lines such that the signal logic level of each of said plurality of lines is compared to that of another line, each of said gate means providing a given logic level output at output means thereof when the input signal logic levels are identical, and
   second logic gate means connected to the output means of all of said N−1 first gate means for receiving input signals therefrom and for providing an output control signal when all inputs are of said given logic level.

* * * * *